United States Patent
Nian et al.

(10) Patent No.: US 8,435,893 B1
(45) Date of Patent: May 7, 2013

(54) SEMICONDUCTOR DEVICE AND METHOD OF FORMATION

(75) Inventors: Jun-Nan Nian, Tainan (TW); Li-Yen Fang, Tainan (TW); Yu-Ting Lin, Tainan (TW); Shih-Chieh Chang, Taipei (TW); Yu-Ku Lin, Tainan (TW); Ying-Lang Wang, Tai-Chung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/304,235

(22) Filed: Nov. 23, 2011

(51) Int. Cl.
*H01L 21/44* (2006.01)

(52) U.S. Cl.
USPC .......................................... 438/682; 438/768

(58) Field of Classification Search ............... 438/580, 438/581, 582, 583, 650, 651, 768; 257/E21.13, 257/E21.296, E21.622
See application file for complete search history.

(56) References Cited

U.S. PATENT DOCUMENTS

2007/0059912 A1* 3/2007 Yun et al. ............ 438/592

* cited by examiner

*Primary Examiner* — Cheung Lee
(74) *Attorney, Agent, or Firm* — Slater & Matsil, L.L.P.

(57) ABSTRACT

A system and method for forming a semiconductor device is provided. An embodiment comprises forming a silicide region on a substrate along with a transition region between the silicide region and the substrate. The thickness of the silicide precursor material layer along with the annealing conditions are controlled such that there is a larger ratio of one atomic species within the transition region than another atomic species, thereby increasing the hole mobility within the transition region.

13 Claims, 8 Drawing Sheets

SEMICONDUCTOR DEVICE AND METHOD OF FORMATION

BACKGROUND

Generally, silicide regions may be formed on a substrate in order to lower the resistance between source and drain regions within the substrate and a contact that may be formed to provide a connection to the source and drain regions. The silicide regions may be manufactured by initially forming a layer of material, such as a layer of a metallic material, over the substrate. This layer of material is also formed in physical contact with the substrate where the silicide regions are desired to be located.

This structure, with the layer of material over and in contact with the substrate, may then be heated to diffuse the layer of material into the substrate and also to diffuse the substrate into the layer of material, wherein the layer of material and the substrate diffuse and react with each other to form a substrate/material compound, thereby forming the silicide region. Once the silicide region has been formed, any excess material that has not reacted with the substrate may be removed using, for example, a selective etching process that can remove the unreacted material without significantly removing the silicide.

Once the silicide has been formed, the composition of the silicide may be tested, for example, using a secondary ion mass spectrometry (SIMS) test. In such a test the surface of the silicide may be bombarded by ions, which impact upon the surface of the silicide to break apart the surface and slowly sputter the surface of the silicide away from the remainder of the substrate. The profile of the surface (and, if charted over time, the overall profile of the silicide) may be obtained by measuring, as a function of time, the secondary ion yield of the surface as it is sputtered. This sputtering may then be correlated to the amount of material removed and can be used to provide a composition profile of the silicide across the depth of the silicide.

BRIEF DESCRIPTION OF THE DRAWINGS

For a more complete understanding of the embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely a silicide contact formed on a substrate with a transistor. The embodiments may also be applied, however, to other contact regions.

Figure 1:
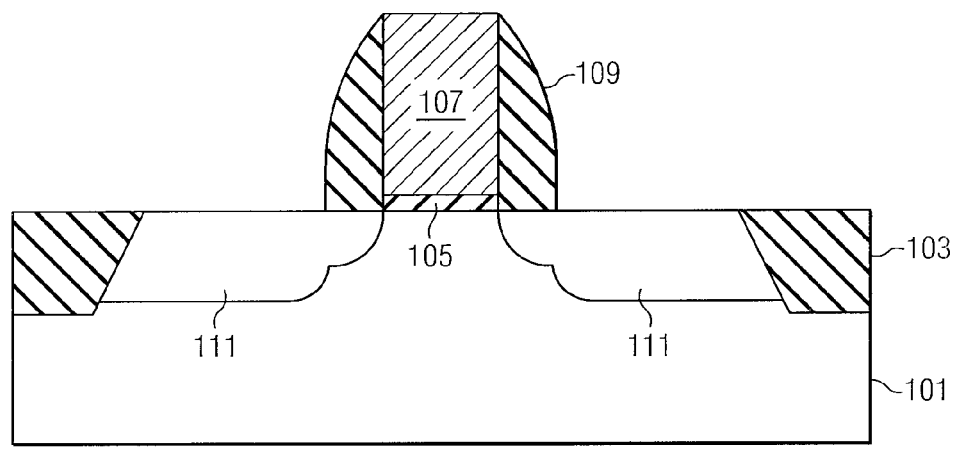
FIG. 1 illustrates a substrate with a gate dielectric, gate electrode, spacers and isolation regions in accordance with an embodiment.

With reference now to FIG. 1, there is shown a substrate 101 with shallow trench isolations (STIs) 103 formed therein. The substrate 101 may comprise a dual element semiconductor material which comprises at least a first element and a second element. In an embodiment the substrate 101 may comprise a dual element semiconductor material such as silicon germanium (SiGe, in which silicon may be the first element and germanium may be the second element), silicon carbon (in which silicon may be the first element and carbon may be the second element), combinations thereof, or the like, and may be doped or undoped. Alternatively, the substrate 101 may be a dual element, active layer of a silicon-on-insulator (SOI) substrate, which may comprise a layer of a dual element semiconductor material such as silicon germanium, silicon carbon, silicon germanium on insulator (SGOI), or combinations thereof. Other substrates that may be used include multi-layered substrates, gradient substrates, or hybrid orientation substrates. In an embodiment in which the substrate 101 is SiGe, the substrate 101 may have a silicon composition of between about 99% and about 1%, such as about 83.8%, and a germanium composition of between about 1% and about 99%, such as about 16.2%.

The STIs 103 may be formed by etching the substrate 101 to form a trench and filling the trench with a dielectric material as is known in the art. For example, the STIs 103 may be filled with a dielectric material such as an oxide material, a high-density plasma (HDP) oxide, or the like, formed by methods known in the art.

A gate dielectric 105, a gate electrode 107, and spacers 109 may be formed over the substrate 101. The gate dielectric 105 may be a dielectric material, such as silicon oxide, silicon oxynitride, silicon nitride, an oxide, a nitrogen-containing oxide, a combination thereof, or the like. The gate dielectric 105 may have a relative permittivity value greater than about 4. Other examples of such materials include aluminum oxide, lanthanum oxide, hafnium oxide, zirconium oxide, hafnium oxynitride, or combinations thereof.

In an embodiment in which the gate dielectric 105 comprises an oxide layer, the gate dielectric 105 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In an embodiment, the gate dielectric 105 may be between about 8 Å to about 200 Å in thickness.

The gate electrode 107 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof, or the like. In an embodiment in which the gate electrode 107 is poly-silicon, the gate electrode 107 may be formed by depositing doped or undoped poly-silicon by low-pressure chemical vapor deposition (LPCVD) to a thickness in the range of about 400 Å to about 2,400 Å, such as about 1,400 Å.

Once the gate dielectric 105 and the gate electrode 107 have been formed, the gate dielectric 105 and gate electrode 107 may be patterned. In an embodiment, the gate dielectric 105 and the gate electrode 107 may be patterned using, e.g., a photolithographic masking and etching process, whereby a photolithographic mask (not shown in FIG. 1) is formed over the gate electrode 107 and then exposed to a patterned light. After exposure, desired portions of the photolithographic mask are removed to exposed the underlying gate electrode 107, which may then be etched to remove the exposed portions, thereby patterning the gate electrode 107 and the gate dielectric 105.

The spacers 109 may be formed by blanket depositing one or more spacer layers (not shown) over the gate electrode 107 and the substrate 101. The spacer layers may comprise SiN, oxynitride, SiC, SiON, oxide, and the like and may be formed by commonly used methods such as chemical vapor deposition (CVD), plasma enhanced CVD (PECVD), sputter, and other methods known in the art. The spacer layers may be patterned, such as by isotropically or anisotropically etching, thereby removing the spacer layers from the horizontal surfaces of the structure and forming the spacers 109 as illustrated in FIG. 1.

However, as one of ordinary skill in the art will recognize, the process described above and the resulting shape of the spacers 109 as illustrated in FIG. 1 are intended to be merely illustrative and are not intended to limit the embodiments to these descriptions. Rather, any suitable number and combination of spacer layers and shapes may be utilized in order to form the spacers 109 for the gate dielectric 105 and the gate electrode 107, and any suitable combination of spacers may alternatively be utilized.

Source/drain regions 111 may be formed in the substrate 101 on opposing sides of the gate dielectric 105. In an embodiment in which the substrate 101 is an n-type substrate, the source/drain regions 111 may be formed by implanting appropriate p-type dopants such as boron, gallium, indium, or the like. Alternatively, in an embodiment in which the substrate 101 is a p-type substrate, the source/drain regions 111 may be formed by implanting appropriate n-type dopants such as phosphorous, arsenic, or the like. These source/drain regions 111 may be implanted using the gate dielectric 105, gate electrode 107, and the spacers 109 as masks.

It should be noted that one of ordinary skill in the art will realize that many other processes, steps, or the like may be used to form these source/drain regions 111. For example, one of ordinary skill in the art will realize that a plurality of implants may be performed using various combinations of spacers and liners to form the source/drain regions 111 to have a specific shape or characteristic suitable for a particular purpose. Any of these processes may be used to form the source/drain regions 111, and the above description is not meant to limit the embodiments to the steps presented above.

Figure 2:
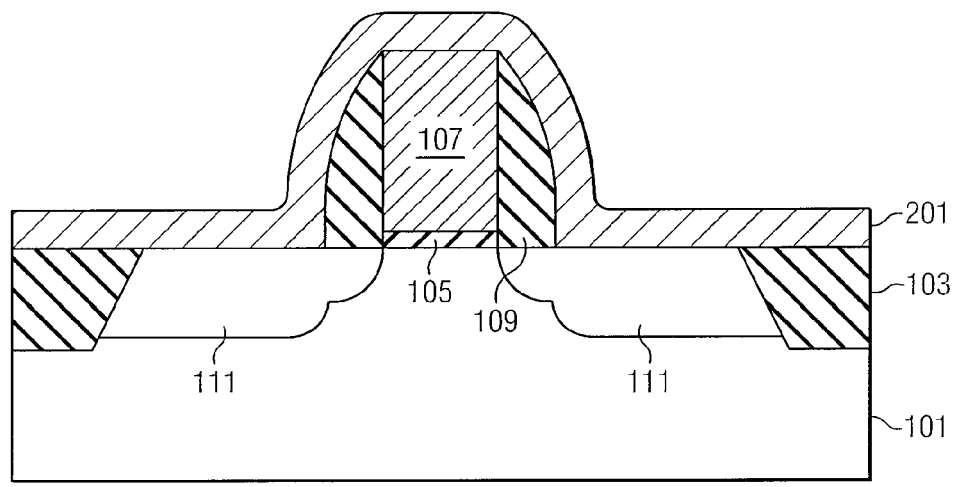
FIG. 2 illustrates the formation of a metal layer over the substrate in accordance with an embodiment.

FIG. 2 illustrates the formation of a metal layer 201 over the substrate 101, the spacers 109, and the gate electrode 107.

The metal layer 201 may comprise a silicide precursor metal such as nickel, and may be formed through a process such as CVD. Alternatively, the metal layer may comprise any other suitable material to form a silicide with the substrate 101, such as titanium, cobalt, palladium, platinum, erbium, combinations of these, and the like, and the metal layer 201 may also be formed through other suitable processes, such as PECVD, physical vapor deposition (PVD), atomic layer deposition (ALD), and the like. In an embodiment the metal layer 201 may be formed to have a thickness that is greater than or equal to about 165 Å, such as about 165 Å. Such a thickness of the metal layer 201, along with an anneal 301 (not shown in FIG. 2 but illustrated and discussed below with respect to FIG. 3A), unexpectedly helps to adjust the relative compositions of the first element and the second element within a transition region 311 (not illustrated in FIG. 2 but illustrated and discussed below with respect to FIG. 3B) formed during the anneal 301. For example, in an embodiment in which the substrate 101 is SiGe (wherein the first element is silicon and the second element is germanium), the thickness of the metal layer 201 may be used to help control the relative percentage of germanium such that at least a portion of the transition region 311 has a larger percentage of germanium than silicon. This control of the relative compositions is discussed in more detail below with respect to FIG. 3B.

Figure 3A:
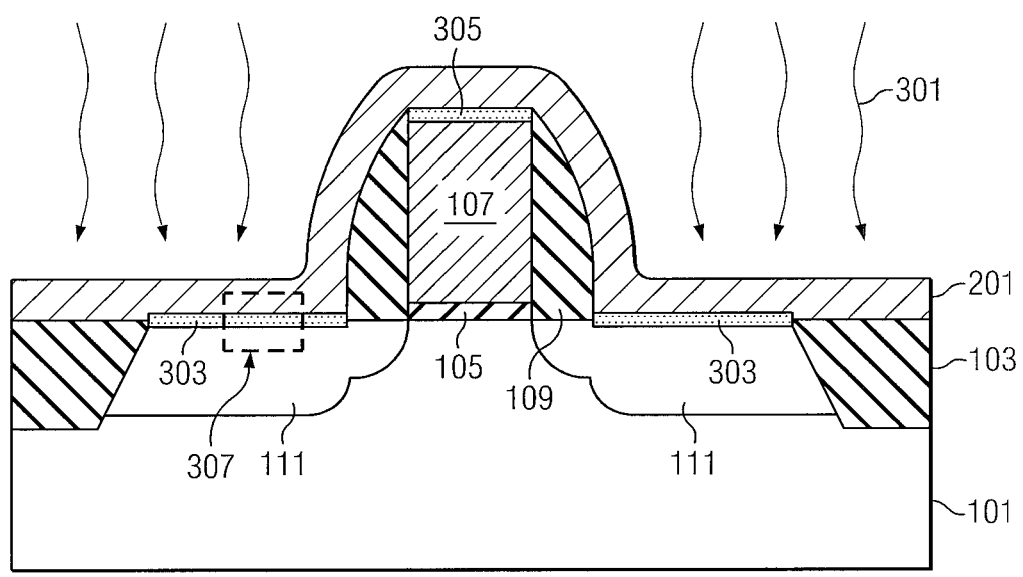
FIG. 3 illustrates an annealing process that may form a first silicide region in accordance with an embodiment.
Figure 3B:
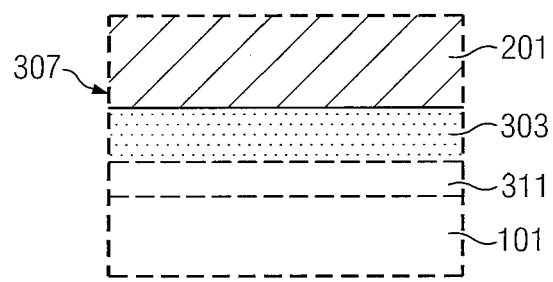

FIGS. 3A-3B illustrate an anneal 301 that may be performed in order to diffuse and react the metal layer 201 with the substrate 101 to form first silicide regions 303 along the substrate 101 and a second silicide region 305 on top of the gate electrode 107. FIG. 3A illustrates a broad view of the formation of the first silicide regions 303 and the second silicide region 305. FIG. 3B illustrates a close up view of a region of FIG. 3A which may include the metal layer 201, one of the first silicide regions 303, the transition region 311, and the substrate 101, as indicated by a first dashed line 307 in FIG. 3A.

In an embodiment, the anneal 301 may be, e.g., a rapid thermal anneal (RTA), where the metal layer 201 and the substrate 101 may be brought to a temperature of between about 150° C. and about 350° C., such as about 255° C., for a time period of between about 30 seconds and about 200 seconds, such as about 60 seconds. However, the embodiments are not intended to be limited to an RTA, as any other suitable thermal treatment, such as a laser anneal, a dynamic surface anneal, combinations of these, or the like, may alternatively be utilized. By utilizing this anneal 301 and the thickness of the metal layer 201, the relative percentages of the first element and the second element within the transition region 311 may be controlled (as discussed further below).

During the anneal 301, the metal layer 201 and the substrate 101 will cross-diffuse into each other, with material from the metal layer 201 diffusing into the substrate 101 and material from the substrate 101 (e.g., the first element and the second element) diffusing into the metal layer 201. Additionally, the material from the metal layer 201 and the material from the substrate 101 will react with each other to form a silicide. For example, in the embodiment in which the substrate 101 is SiGe and the metal layer 201 is nickel, the substrate 101 and the metal layer 201 will diffuse and react with other to form the first silicide regions 303 of $Ni_x(SiGe)_{(1-x)}$.

Additionally, because of the diffusion of the materials into each other, the transition region 311 (see FIG. 3B) will also be formed between the first silicide regions 303 and the substrate 101 with a thickness of between about 2 nm and about 50 nm, such as about 10 nm. This transition region 311 may comprise a mixture of the first element and the second element from the substrate 101 along with material from the metal layer 201, with the composition of the individual elements within the transition region 311 being determined by the diffusion of the atoms of the individual elements through the transition region 311. In an embodiment in which the metal layer 201 comprises nickel and the substrate 101 comprises SiGe (with the first element being silicon and the second element being germanium), the transition region 311 may comprise a mixture of silicon, germanium, and nickel, as the individual atoms of these elements diffuse at different rates into the transition region 311. In such an embodiment, the transition region 311 may be seen as starting where the material from the metal layer 201 is at a maximum may continue until after the material from the metal layer 201 has a lower concentration than the first element.

By utilizing the thickness of the metal layer 201 and the temperature of the anneal 301, the diffusion of the individual elements may be controlled to increase the hole mobility of the transition region 311. In particular, the composition of at least a portion of the transition region 311 may be controlled by these process conditions such that a composition of the second element (e.g., germanium) may be increased to a greater level than the first element (e.g., silicon). With the composition of the second element being greater than or equal to the first element, the hole mobility of the transition region 311 may also be increased, thereby improving the overall performance of the connection between the first silicide regions 303 and the source/drain regions 111.

Figure 4A:
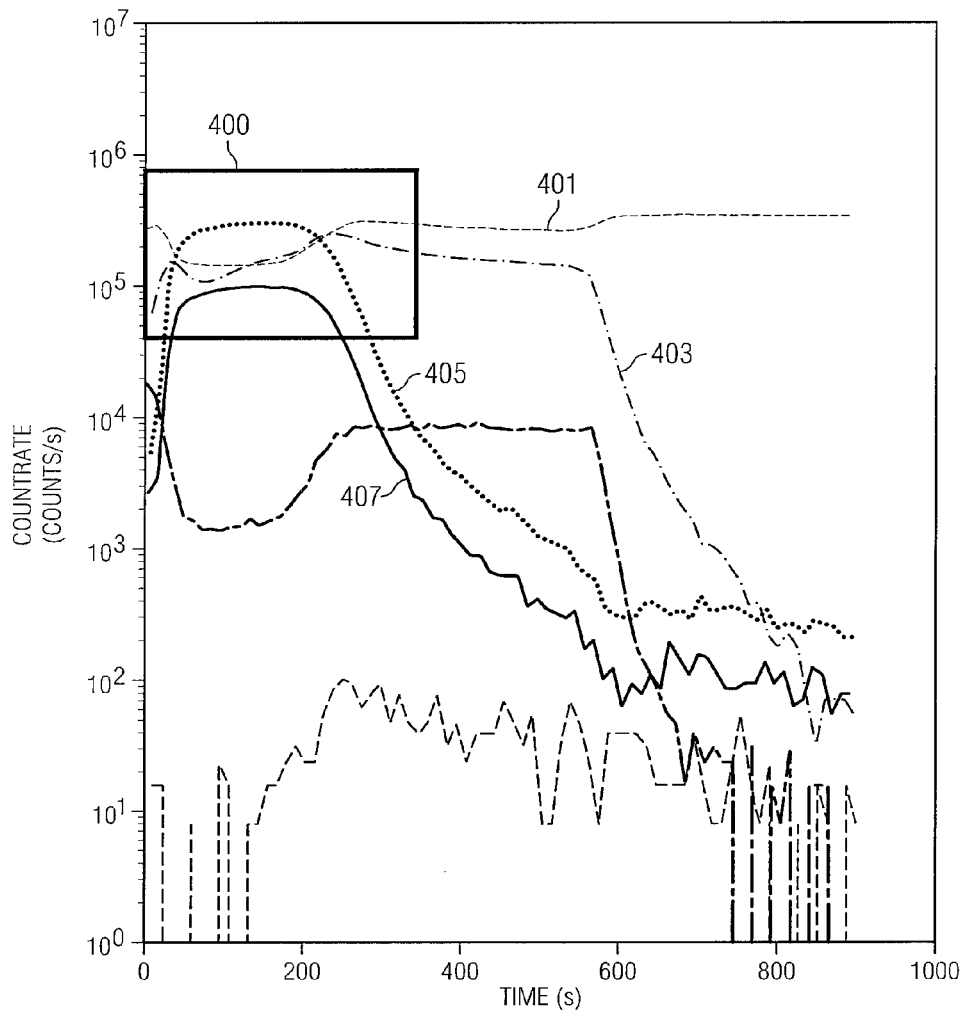
FIGS. 4A and 4B illustrate the composition of a transitional region between the first silicide region and the substrate in accordance with an embodiment.
Figure 4B:
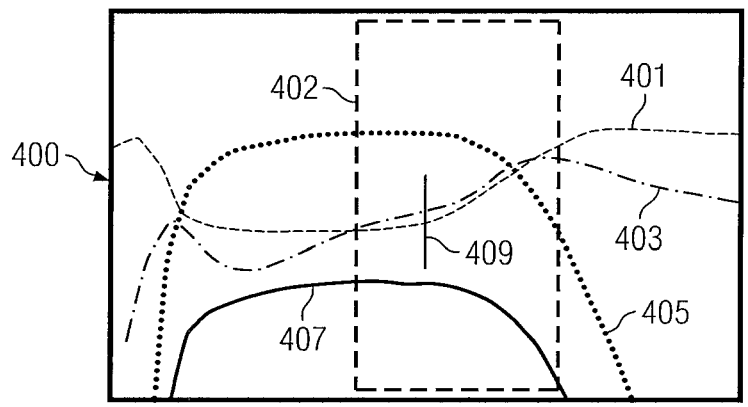

FIGS. 4A and 4B illustrate a result of such a controlled formation in the embodiment in which the metal layer 201 is nickel, the substrate 101 is SiGe, the metal layer 201 is formed to a thickness of 165 Å, and the anneal 301 is performed at a temperature of 255° C. FIG. 4B illustrates a close up of a region of FIG. 4A surrounded by a second dashed line 400 in FIG. 4A. Additionally within FIG. 4B, the portion of the chart corresponding to the transition region 311 is surrounded by a third dashed line 402.

In FIGS. 4A and 4B the composition of the first silicide regions 303, the transition region 311, and the substrate 101 were measured by a secondary ion mass spectrometry (SIMS) test. In this type of test, the surface of, e.g., one of the first silicide regions 303 is sputtered with ions and the secondary ions that are sputtered off of the surface of one of the first silicide regions 303 are then counted to determine the composition of the surface of one of the first silicide regions 303. As this test continues over time, the surface of one of the first silicide regions 303 is sputtered away until the sputtering exposes the surface of the transition region 311 and then, eventually, the substrate 101. As such, by counting the secondary ions throughout the process, a profile of the composition of one of the first silicide regions 303, the transition region 311, and the substrate 101 were determined over time.

Given this, FIGS. 4A-4B illustrate the count of silicon atoms and, therefore, a relative composition of silicon within the various layers (such as the first silicide regions 303, the transition region 311, and the substrate 101) along a first line 401. FIGS. 4A-4B also illustrate the count of germanium atoms and, therefore, a relative composition of germanium within the various layers, along a second line 403. Additionally, FIGS. 4A-4B illustrate the count of nickel atoms and, therefore, a relative composition of nickel within the various layers, along a third line 405 and a fourth line 407, with the third line 405 and the fourth line 407 counting two separate types of nickel ions.

By controlling the thickness of the metal layer 201 and controlling the temperature of the anneal 301, FIGS. 4A-4B illustrate that the ratio of germanium (as detailed by the second line 403) to silicon may be flipped within the transition region 311 from the remainder of the substrate 101, as the ratio of germanium may be larger than the ratio of silicon (as detailed by the first line 401) within at least a portion of the transition region 311 (as illustrated by the third dashed line 402 in FIG. 4B). For example, the count of germanium within the transition region 311 as illustrated in FIG. 4B along reference line 409 may be about $1.63\text{ E}+5$ while the count of silicon along the reference line 409 may be about $1.5\text{ E}+5$. By controlling the thickness of the metal layer 201 and the temperature of the anneal 301, the germanium content may be increased to be larger than the silicon content within at least a portion of the transition region 311, causing the hole mobility of the transition region 311 to increase and increasing the overall efficiency of the transition region 311.

Figure 5A:
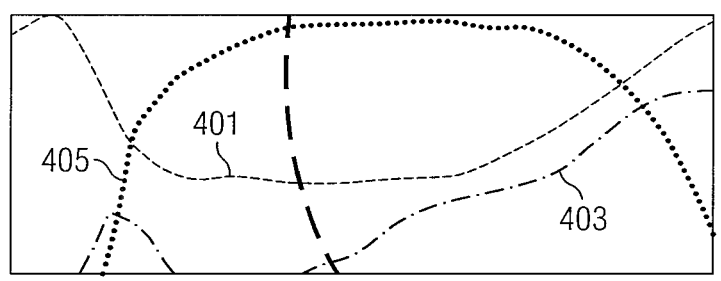
FIGS. 5A-5E illustrate the results of other process conditions and help to show the benefits of the process conditions in accordance with an embodiment.
Figure 5B:
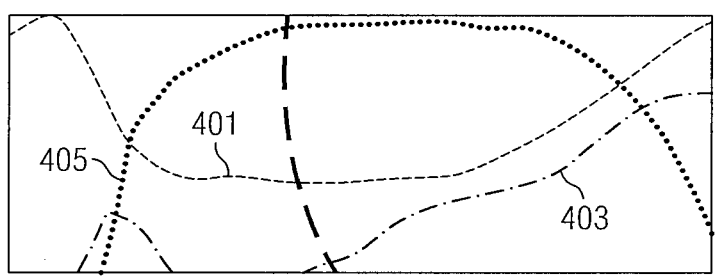
Figure 5C:
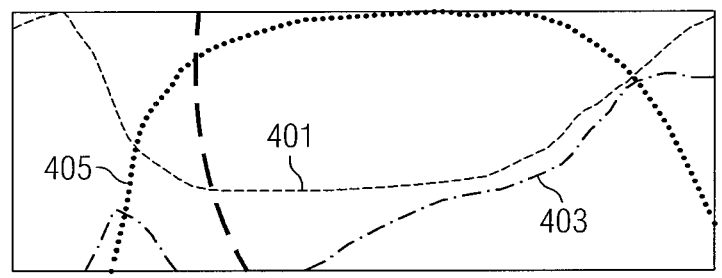

FIGS. 5A-5E illustrate the results of other thicknesses of the metal layer 201 and other temperatures for the anneal 301 than the thicknesses and temperatures described above with respect to FIGS. 1-4B. Each of these figures illustrate a similar transition region 311 formed under different process conditions than the chart illustrated in FIG. 4B. FIGS. 5A-5C illustrate the relative compositions of silicon and germanium for an anneal performed at 260° C. More specifically, FIG. 5A illustrates the ratio of silicon and germanium with a metal layer 201 thickness of about 155 Å, FIG. 5B illustrates the ratio of silicon and germanium with a metal layer 201 thickness of about 160 Å, and FIG. 5C illustrates the ratio of silicon and germanium with a metal layer 201 thickness of about 165 Å.

As illustrated, with an anneal performed at 260° C., none of the illustrated charts achieve a germanium composition larger than a silicon composition anywhere within the chart. As such, increasing the thickness of the metal layer 201 may be utilized to increase the ratio of germanium to silicon within the transition region 311 (see, e.g., the closeness of the first line 401 to the second line 403 in FIG. 5C), but is not enough, by itself, to generate a composition of germanium that is greater than or equal to a composition of silicon within the transition region 311.

Figure 5D:
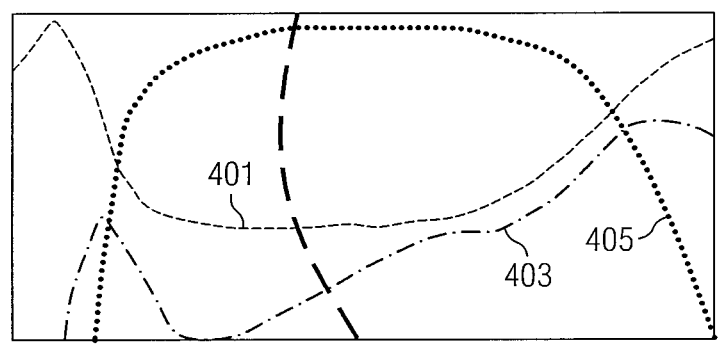
Figure 5E:
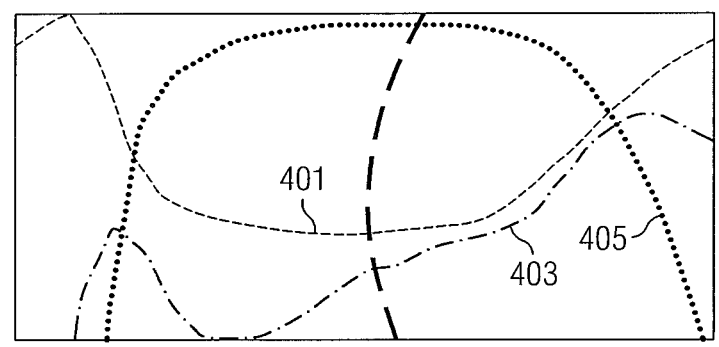

Additionally, FIGS. 5D-5E illustrate the compositions of silicon and germanium that may occur with a constant metal layer 201 thickness of about 165 Å. More specifically, FIG. 5D illustrates the compositions of silicon and germanium when the anneal 301 is performed at a temperature of about 260° C. and FIG. 5E illustrates the compositions of silicon and germanium when the anneal 301 is performed at a temperature of about 259° C. As illustrated, and similar to FIGS. 5A-5C, none of the illustrated charts achieve a germanium ratio larger than a silicon composition anywhere within the chart.

Given these results, the process conditions as described above with respect to FIGS. 1-4B may achieve a composition of the second element (e.g., germanium) that is greater than or equal to a composition of the first element (e.g., silicon) that other process conditions do not. Without such controlled process conditions, for example, the composition of germanium will not be larger than the composition of silicon at any point within the transition region 311. As such, without these process conditions as described above with respect to FIGS. 1-4B, the benefits of having the composition of the second element being greater than or equal to the composition of the first element (e.g., having the composition of germanium being greater than or equal to the composition of silicon) within the transition region 311 will not be achieved.

Figure 6:
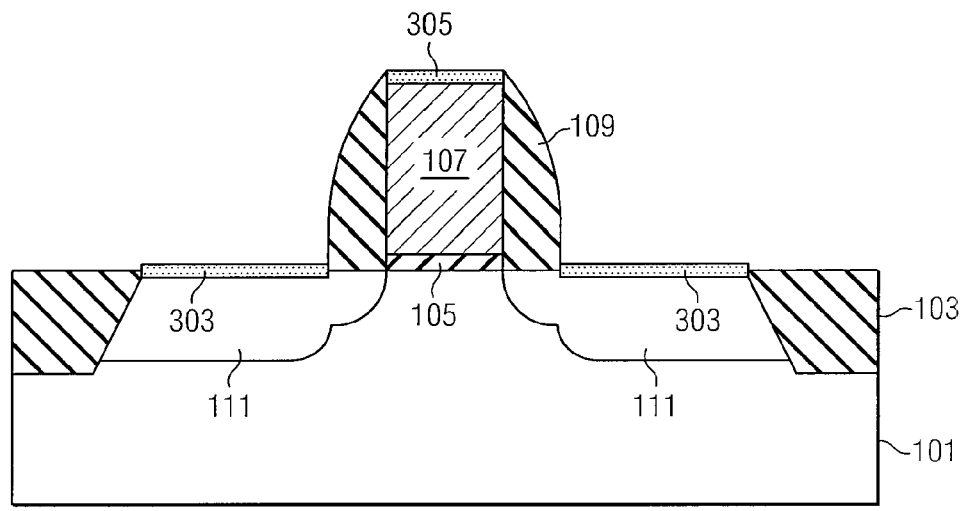
FIG. 6 illustrates the removal of unreacted metal layer material in accordance with an embodiment.

FIG. 6 illustrates a removal of the metal layer 201 after the formation of the first silicide regions 303 and the second silicide region 305. In an embodiment the unreacted metal layer 201 may be removed using an etchant that selectively removes the unreacted metal layer 201 without removing the silicide, such as a solution of sulfuric acid and hydrogen peroxide, a solution of hydrochloric acid and hydrogen peroxide, or the like. Additionally, any other suitable removal agent may alternatively be utilized to remove the metal layer 201 from over the substrate 101.

Figure 7:
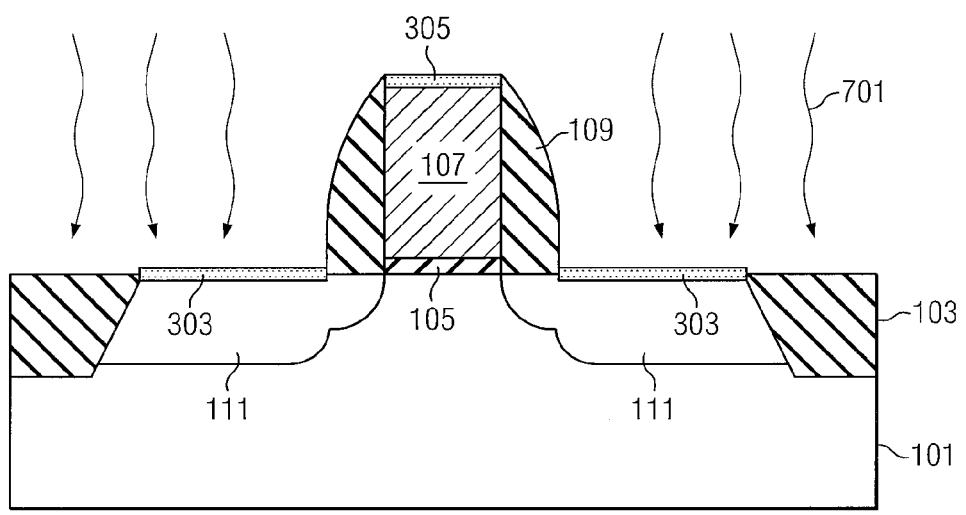
FIG. 7 illustrates an optional secondary anneal that may be performed on the first silicide region in accordance with an embodiment.

FIG. 7 shows an optional secondary anneal 701 that may be performed to change the phase of the first silicide regions 303 and the second silicide region 305 in order to further reduce the resistance of the first silicide regions 303 and the second silicide region 305. In an embodiment the secondary anneal 301 may be a flash anneal or a dynamic surface anneal which may raise the temperature of the first silicide regions 303 and the second silicide region 305 between about 250° C. and about 500° C., such as about 350° C. The secondary anneal 701 may be performed for about 5 seconds and about 300 seconds, such as about 30 seconds.

Figure 8:
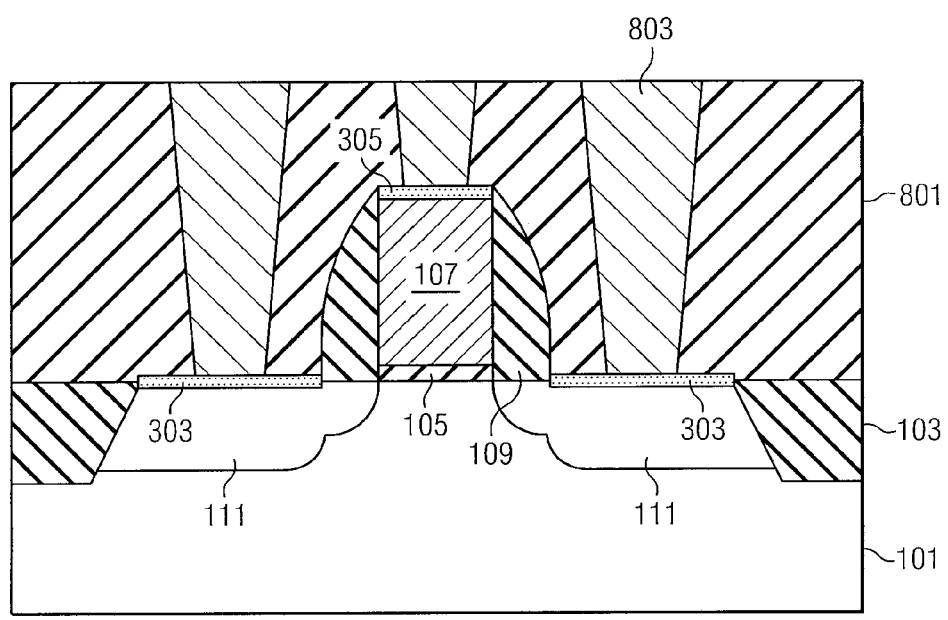
FIG. 8 illustrates the formation of an inter-layer dielectric and contacts extending through the inter-layer dielectric in accordance with an embodiment.

FIG. 8 illustrates a deposition and patterning of an inter-level dielectric (ILD) layer 801 and the formation of contacts 803 through the ILD layer 801. In an embodiment, the ILD layer 801 may comprise a dielectric such as an oxide that may be formed by chemical vapor deposition (CVD) techniques using tetra-ethyl-ortho-silicate (TEOS) and oxygen as precursors. However, other methods and dielectric materials known in the art may be used. Additionally, the ILD layer 801 may be between about 4,000 Å and about 13,000 Å in thickness, but other thicknesses may be used. The surface of the ILD layer 801 may be planarized, such as by a chemical mechanical polishing (CMP) process using an oxide slurry.

After the ILD layer 801 has been formed, contacts 803 may be formed and connected to the first silicide regions 303 and the second silicide region 305. In an embodiment the contacts 803 may be formed through a lithographic masking and etching process, whereby masks (not shown) may be deposited onto the surface of the ILD layer 801, openings may be etched into the surface, and conductive material (such as tungsten or copper) may be used to fill the openings. It should be noted that the contacts 803 may comprise one or more layers of conductive material, and may also include barrier layers, adhesive layers, seed layers, or the like.

Figure 9:
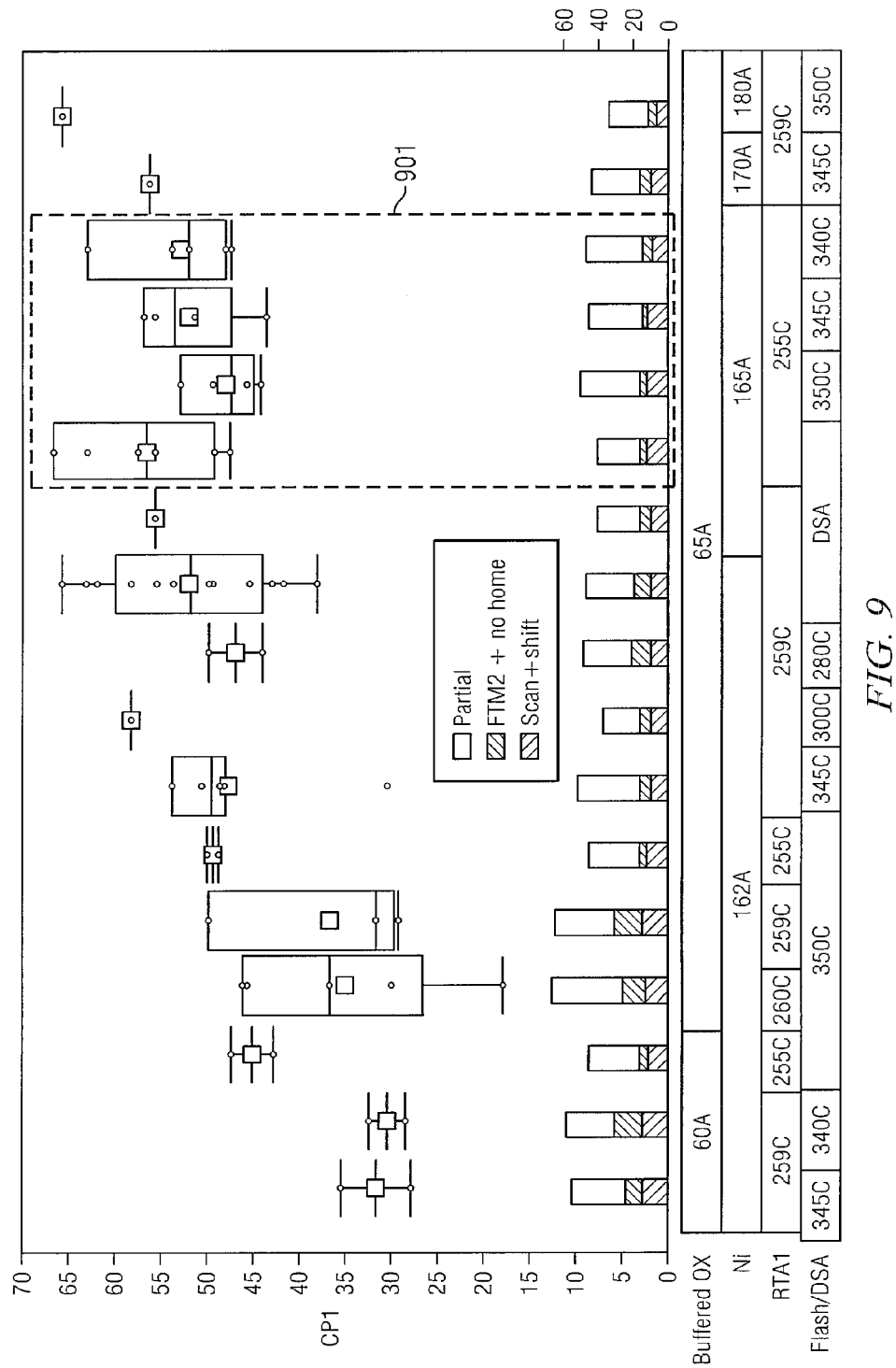
FIG. 9 illustrates another benefit of the desired process conditions in accordance with an embodiment.

FIG. 9 illustrates an additional benefit of utilizing the thickness of the metal layer 201 and the temperature of the anneal 301 as described above with respect to FIGS. 1-4B. In FIG. 9, a chart is shown illustrating a product yield rate (on the y-axis) based off of various process conditions (illustrated along the x-axis) for silicides formed on a buffered oxide. The product yield rates on the y-axis were determined by pass/fail results from three different tests (a partial test, a FTM2 clock test that tests the time delay, and a scan and shift test). For example, the first column of the chart illustrates the resulting product yield rate on a silicide formed on a buffered oxide layer having a thickness of 60 Å, a metal layer 201 having a thickness of 162 Å, an anneal that is a rapid thermal anneal performed at a temperature of 259° C., and a flash anneal performed at a temperature of 345° C. Additionally within FIG. 9, the structures that were formed utilizing the process conditions as described above with respect to FIGS. 1-4B, such as a metal layer thickness of at least 165 Å and a rapid thermal anneal performed at a temperature of 255° C., have been highlighted with a fourth dashed line 901 in FIG. 9.

As can be seen, when the process conditions as described above with respect to FIGS. 1-4B are utilized, the overall product yield rate, while not being higher than each and every one of the other process conditions, has a larger product yield rate in general than the remaining process conditions. As such, in addition to increasing the hole mobility in the transition region 311, the process conditions described above with respect to FIGS. 1-4B also contribute to improving the overall product yield of silicides formed with these conditions.

In accordance with an embodiment, a method of forming a semiconductor device comprising forming a metal layer on a substrate, the metal layer having a thickness between about 10 Å and 500 Å, is provided. The substrate comprises a first atomic species and a second atomic species, the first atomic species being silicon, and the metal layer and the substrate are annealed at a temperature between about 150° C. to 350° C., the annealing the metal layer and the substrate forming a silicide region and a transition region, the transition region being located between the silicide region and a remaining portion of the substrate.

In accordance with another embodiment, a method of manufacturing a semiconductor device comprising depositing a silicide precursor material onto a substrate, the silicide precursor material having a thickness between about 10 Å to 500 Å, the substrate comprising a first atomic material and a second atomic material different from the first atomic material, the first atomic material being silicon, is provided. A silicide layer and a transition region are formed from the silicide precursor material and the substrate, wherein the forming the silicide layer and the transition region comprises a first annealing process at a temperature between about 150° C. to 350° C.

In accordance with yet another embodiment, a semiconductor device comprising a transition region between a substrate and a silicide is provided. A first atomic species is located within the transition region and the substrate, wherein the first atomic species comprises silicon, and a second atomic species is located within the transition region and the substrate, wherein the second atomic species is different from the first atomic species and has a ratio within the transition region greater than or equal to the first atomic species and wherein the second atomic species has a ratio within the substrate that is less than the first atomic species.

Although the embodiments and their advantages have been described in detail, it should be understood that various changes, substitutions and alterations can be made herein without departing from the spirit and scope of the embodiments as defined by the appended claims. For example, it will be readily understood by those skilled in the art that the materials may be varied while remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A method of forming a semiconductor device, the method comprising:
   forming a metal layer on a substrate, the metal layer having a thickness between about 10 Å and 500 Å, the substrate comprising a first atomic species and second atomic species, the first atomic species being silicon; and annealing the metal layer and the substrate at a temperature between about 150° C. to 350° C., the annealing the metal layer and the substrate forming a silicide region and a transition region, the transition region being located between the silicide region and a remaining portion of the substrate.

2. The method of claim 1, wherein the annealing the metal layer and the substrate further forms a first region within the transition region having a larger ratio of the second atomic species than the first atomic species.

3. The method of claim 1, wherein the second atomic species is germanium.

4. The method of claim 1, wherein the forming the metal layer comprises forming a layer of nickel.

5. The method of claim 1, wherein annealing the metal layer and the substrate forms the transition region to a thickness of between about 2 nm and about 50 nm in thickness.

6. The method of claim 1, further comprising:
removing unreacted metal layer after the forming the silicide region and the transition region; and
annealing the silicide region.

7. The method of claim 1, wherein the second atomic species is germanium and the forming the metal layer comprises forming a layer of nickel.

8. A method of manufacturing a semiconductor device, the method comprising:

depositing a silicide precursor material onto a substrate, the silicide precursor material having a thickness between about 10 Å to 500 Å, the substrate comprising a first atomic material and a second atomic material different from the first atomic material, the first atomic material being silicon; and forming a silicide layer and a transition region from the silicide precursor material and the substrate, wherein the forming the silicide layer and the transition region comprises a first annealing process at a temperature between about 150° C. to 350° C.

9. The method of claim 8, wherein the transition region has a composition of the second atomic material greater than a composition of the first atomic material.

10. The method of claim 8, further comprising removing unreacted silicide precursor material after the forming the silicide layer.

11. The method of claim 8, further comprising performing a second annealing process after the forming the silicide layer and the transition region.

12. The method of claim 8, wherein the second atomic material is germanium.

13. The method of claim 8, further comprising performing a flash anneal after the forming the silicide layer and the transition region.

* * * * *